US012608036B2

(12) United States Patent
Seeger

(10) Patent No.: US 12,608,036 B2
(45) Date of Patent: Apr. 21, 2026

(54) DIRECT DIGITAL SYNTHESIZER CIRCUIT, MEASUREMENT SYSTEM, AND METHOD OF OPERATING A DIRECT DIGITAL SYNTHESIZER CIRCUIT

(71) Applicant: Rohde & Schwarz GmbH & Co. KG, Munich (DE)

(72) Inventor: Julius Seeger, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 202 days.

(21) Appl. No.: 18/543,676

(22) Filed: Dec. 18, 2023

(65) Prior Publication Data

US 2024/0210985 A1 Jun. 27, 2024

(30) Foreign Application Priority Data

Dec. 22, 2022 (EP) .................................... 22216129

(51) Int. Cl.
*G06F 1/03* (2006.01)
*G01R 31/28* (2006.01)
(Continued)

(52) U.S. Cl.
CPC ....... *G06F 1/0328* (2013.01); *G01R 31/2841* (2013.01); *G06F 1/022* (2013.01); *G06F 1/08* (2013.01)

(58) Field of Classification Search
CPC ....... H03L 7/099; H03L 7/0994; H03L 7/095; H03L 1/00; H03L 7/081; G06F 1/02; G06F 17/10; H03M 3/30
See application file for complete search history.

(56) References Cited

U.S. PATENT DOCUMENTS 6,236,267 B1 * 5/2001 Anzil ....................... H03C 5/00
332/159
9,244,885 B1 1/2016 Old et al.
(Continued)

FOREIGN PATENT DOCUMENTS

EP 0538903 A1 4/1993
GB 2352346 A 1/2001
(Continued)

OTHER PUBLICATIONS

Bozic, M. et al., "Elimination of Non-Harmonic Spurious in Direct Digital Synthesis," Jan. 1993; pp. 1-6; figures 1-6.

*Primary Examiner* — Son T Le
(74) *Attorney, Agent, or Firm* — CHRISTENSEN O'CONNOR JOHNSON KINDNESS PLLC

(57) ABSTRACT

A DDS circuit includes a phase accumulator circuit. The phase accumulator circuit includes a clock input being configured to receive a clock signal. The phase accumulator circuit includes a frequency tuning register configured to receive a frequency tuning word (FTW), and a phase shift register configured to receive a phase shift word (PSW). The phase accumulator circuit also includes a phase increment sub-circuit configured to increment a phase signal output by the phase accumulator circuit by a predetermined phase increment based on the clock signal and/or based on the FTW. The phase accumulator circuit further includes a feedback path configured to feed back the phase signal to the phase increment sub-circuit. The phase accumulator circuit further includes a phase correction sub-circuit configured to adapt the phase signal fed back to the phase increment sub-circuit based on the phase shift word.

15 Claims, 4 Drawing Sheets

(51) Int. Cl.
    *G06F 1/02*          (2006.01)
    *G06F 1/08*          (2006.01)

(56)             References Cited

U.S. PATENT DOCUMENTS

| | | |
|---|---|---|
| 9,520,831 B1 | 12/2016 | Foster et al. |
| 10,705,556 B2 | 7/2020 | Kapur et al. |
| 2009/0256640 A1 * | 10/2009 | Reilly .................. G06F 1/0328 |
| | | 331/45 |
| 2016/0164531 A1 | 6/2016 | Dionne et al. |

FOREIGN PATENT DOCUMENTS

| | | | | |
|---|---|---|---|---|
| JP | 2008079261 A | * | 4/2008 |
| MY | 186548 A | * | 7/2021 |
| WO | 2009/126374 | | 10/2009 |

* cited by examiner

S1 — generate analog output signals

S2 — forward analog output signals to analysis module

S3 — determine phase difference between output signals

S4 — determine phase shift word

S5 — write phase shift word into phase shift register

S6 — adapt phase of analog output signal of DDS module(s)

DIRECT DIGITAL SYNTHESIZER CIRCUIT, MEASUREMENT SYSTEM, AND METHOD OF OPERATING A DIRECT DIGITAL SYNTHESIZER CIRCUIT

FIELD OF THE DISCLOSURE

Embodiments of the present disclosure generally relate to a direct digital synthesizer circuit. Embodiments of the present disclosure further relate to a measurement system and to a method of operating a direct digital synthesizer circuit.

BACKGROUND

Direct digital synthesizers are, referring to the CLK of the phase accumulator, highly phase stable. Modern direct digital synthesizers enable the user to set the frequency and initial phase via dedicated registers, namely via an FTW (frequency tuning word) and an initial phase.

Certain measurement setups require two or more direct digital synthesizers having a predefined phase relation to each other. In the state of the art, this phase relation is usually achieved by setting the respective initial phase values of the direct digital synthesizers, wherein the initial phase values of all direct digital synthesizers have to be set simultaneously within a single clock cycle.

Thus, setting the initial phase values of the direct digital synthesizers has to be timed in a very precise manner in order to set a desire phase relation between the direct digital synthesizers.

Accordingly, there is a need for a direct signal synthesizer circuit that allows for a less time-critical setting of the phase relation.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a direct digital synthesizer (DDS) circuit. In an embodiment, the DDS circuit comprises a phase accumulator circuit. The phase accumulator circuit comprises a clock input being configured to receive a clock signal. The phase accumulator circuit further comprises a frequency tuning register being configured to receive a frequency tuning word (FTW). The phase accumulator circuit further comprises a phase shift register being configured to receive a phase shift word (PSW). The phase accumulator circuit further comprises a phase increment sub-circuit being configured to increment a phase signal output by the phase accumulator circuit by a predetermined phase increment based on the clock signal and/or based on the FTW. The phase accumulator circuit further comprises a feedback path being configured to feed back the phase signal to the phase increment sub-circuit. The phase accumulator circuit further comprises a phase correction sub-circuit, wherein the phase correction sub-circuit is configured to adapt the phase signal fed back to the phase increment sub-circuit based on the phase shift word.

According to the present disclosure, the phase signal fed back to the phase increment sub-circuit is adapted based on the PSW in order to obtain a desired phase signal that is output by the phase accumulator circuit. In other words, the phase of an output signal of the DDS circuit is adapted by adapting the phase signal fed back to the phase increment sub-circuit based on the PSW. Thus, a desired phase relation between an output signal of the DDS circuit and another signal, e.g. another output signal of another DDS circuit, can be obtained by providing the PSW to the DDS circuit.

In some embodiments, the phase signal fed back to the phase increment sub-circuit can be adapted in an arbitrary clock cycle of the phase accumulator circuit.

Thus, instead of initializing multiple DDS circuits simultaneously, a phase correction is applied to the phase signal fed back to the phase increment sub-circuit, which is not time-critical and does not require a precise coordination of multiple different DDS circuits.

In an embodiment, the DDS circuit may comprise a converter circuit downstream of the phase accumulator circuit, wherein the converter circuit is configured to convert the phase signal output by the phase accumulator circuit into an amplitude signal. In general, the converter circuit is configured to map the phase of the phase signal to a corresponding amplitude of the amplitude signal, such that signals having arbitrary shape can be generated, e.g. sine-shaped amplitude signals, sawtooth-shaped amplitude signals, etc.

In any embodiment, the DDS circuit may comprise a digital-to-analog converter (DAC) downstream of the phase accumulator circuit, for example downstream of the converter circuit. The DAC is configured to convert a digital output signal of the DDS circuit, for example the amplitude signal, into an analog output signal of the DDS circuit.

In any embodiment, the DDS circuit may be integrated on a chip. For example, the chip may be a dedicated DDS chip. However, it is to be understood that the DDS circuit may also be integrated on a chip together with other electronic components.

According to an aspect of the present disclosure, the phase correction sub-circuit, for example, is configured to receive a phase shift trigger signal, wherein the phase correction sub-circuit is configured to adapt the phase signal fed back to the phase increment sub-circuit upon receiving the phase shift trigger signal. In other words, the timing of adapting the phase signal fed back to the phase increment sub-circuit can be controlled by providing the phase shift trigger signal to the phase correction sub-circuit.

In an embodiment of the present disclosure, the phase correction sub-circuit is configured to replace the phase signal fed back to the phase increment sub-circuit with a corrected phase signal. In some embodiments, the phase correction sub-circuit comprises a multiplexer sub-circuit, wherein the multiplexer sub-circuit is configured to selectively forward the phase signal or the corrected phase signal to the phase increment sub-circuit. In other words, instead of feeding back an actual phase signal output by the phase increment sub-circuit, the corrected phase signal is fed back or forwarded to the phase increment sub-circuit. This way, an arbitrary phase signal can be set.

Therein, the corrected phase signal may correspond to the desired phase signal that should be output by the phase accumulator circuit in the current clock cycle.

During normal operation, the multiplexer sub-circuit may be configured or controlled to feed back the phase signal output by the phase increment sub-circuit to the phase increment sub-circuit.

In order to adapt the phase of the (analog) output signal of the DDS circuit, the multiplexer sub-circuit is controlled in some embodiments to forward the corrected phase signal to the phase increment sub-circuit instead of the actual phase signal output by the phase increment sub-circuit for a predetermined time interval, e.g. for one clock cycle.

For example, the multiplexer sub-circuit may be controlled by the phase shift trigger signal described above, such that the multiplexer sub-circuit forwards the corrected phase signal to the phase increment sub-circuit upon receiving the phase shift trigger signal.

According to another aspect of the present disclosure, the phase correction sub-circuit, for example, is configured to replace the phase signal fed back to the phase increment sub-circuit with a corrected phase signal during a single clock cycle of the clock signal. Accordingly, during a certain clock cycle, the phase correction sub-circuit receives the corrected phase signal instead of the phase signal output by the phase correction sub-circuit. During the next clock cycle, the phase correction sub-circuit receives the phase signal output by the phase correction sub-circuit via the feedback path, which corresponds to the corrected phase signal incremented by the predetermined phase increment. Thus, the correction or adaptation of the phase of the output signal of the DDS circuit can be performed within a single clock cycle.

A further aspect of the present disclosure provides, for example, that the phase correction sub-circuit is configured to add a phase correction signal to the phase signal fed back to the phase increment sub-circuit. In some embodiments, the phase correction sub-circuit comprises an adder sub-circuit, wherein the adder sub-circuit is configured to add the phase correction signal to the phase signal fed back to the phase increment sub-circuit. In other words, the phase signal output by the phase increment sub-circuit is corrected by adding the phase correction signal, such that a desired phase signal is obtained.

Accordingly, the phase correction signal may correspond to the difference between the desired phase signal and the actual phase signal output by the phase accumulator circuit in the current clock cycle.

In an embodiment, the phase correction sub-circuit may comprise a multiplexer sub-circuit, wherein the multiplexer sub-circuit is configured to selectively forward the phase correction signal to the adder sub-circuit. More precisely, the multiplexer sub-circuit is configured to selectively forward the phase correction signal or a zero-signal to the adder sub-circuit, wherein the zero-signal does not alter the phase signal when added to the phase signal.

During normal operation, the multiplexer sub-circuit may be configured or controlled to forward the zero-signal to the adder sub-circuit or to forward no signal at all.

In order to adapt the phase of the (analog) output signal of the DDS circuit, the multiplexer sub-circuit is controlled in some embodiments to forward the phase correction signal to the adder sub-circuit for a predetermined time interval, e.g. for one clock cycle.

For example, the multiplexer sub-circuit may be controlled by the phase shift trigger signal described above, such that the multiplexer sub-circuit forwards the phase correction signal to the adder sub-circuit upon receiving the phase shift trigger signal.

In some embodiments, the phase correction sub-circuit is configured to add the phase correction signal to the phase signal fed back to the phase increment sub-circuit during a single clock cycle of the clock signal. Thus, the correction or adaptation of the phase of the output signal of the DDS circuit can be performed within a single clock cycle.

Embodiments of the present disclosure further provide a measurement system. The measurement system comprises at least one DDS circuit according to any one of the embodiments described above.

Regarding the advantages and further properties of the measurement system, reference is made to the explanations given above with respect to the DDS circuit, which also hold for the measurement system and vice versa.

In an embodiment, the measurement system may comprise a measurement instrument, wherein the at least one DDS circuit is integrated into the measurement instrument. For example, the measurement instrument may be an oscilloscope, for example a digital oscilloscope, a vector network analyzer, a spectrum analyzer, a standalone signal generator, etc.

According to an aspect of the present disclosure, the measurement system comprises, for example, an analysis circuit. In an embodiment, the analysis circuit is configured to receive an analog output signal of the at least one DDS circuit, wherein the analysis circuit is further configured to receive a phase reference signal, and wherein the analysis circuit is configured to determine the PSW based on the analog output signal of the at least one DDS circuit and based on the phase reference signal.

In some embodiments, the analysis circuit may be configured to determine a phase difference between the analog output signal of the at least one DDS circuit and the phase reference signal. The analysis circuit may further be configured to determine the PSW based on the determined phase difference.

In an embodiment, the analysis circuit may further be configured to forward the determined PSW to the at least one DDS circuit, or more precisely to the phase shift register of the at least one DDS circuit.

In an embodiment, the analysis circuit may be integrated into the measurement instrument described above. However, it is also conceivable that the analysis circuit is integrated into another electronic device.

According to another aspect of the present disclosure, the measurement system comprises, for example, at least one further DDS circuit, wherein the phase reference signal is an analog output signal of the at least one further DDS circuit. The at least one further DDS circuit may be configured like the DDS circuit described above, but this is not necessary.

In some embodiments, in order to set a particular phase relation of analog outputs signals of two DDS circuits, only a single PSW has to be determined for one of the two DDS circuits.

If a total number of N DDS circuits is provided, and phase relations between the N DDS circuits are to be set, (N-1) PSWs have to be determined by the analysis circuit.

In some embodiments, the phases of the analog output signals of (N-1) DDS circuits may be adapted relative to the phase of the analog output signal of the remaining DDS circuit based on the (N-1) determined PSWs.

In some embodiments, the analysis circuit is configured to repeatedly determine the PSW in predefined time intervals. In other words, the phase relation between the analog output signal of the at least one DDS circuit and the phase reference signal may be monitored continuously, and the phase of the analog output signal of the at least one DDS circuit may be corrected by providing an appropriate PSW to the at least one DDS circuit if necessary.

Alternatively or additionally, the analysis circuit may be configured to determine the PSW after the FTW of the at least one DDS circuit has been updated. Thus, it is ensured that a desired phase relation between the analog output signal of the at least one DDS circuit and the phase reference signal is obtained after the FTW has been updated.

In an embodiment of the present disclosure, the measurement system comprises a directional coupler, wherein the directional coupler is configured to forward the analog output signal of the at least one DDS circuit to the analysis circuit. The directional coupler may further be configured to forward the analog output signal of the at least one DDS circuit to a measurement port, to another electronic component, or to another signal path.

In some embodiments, the directional coupler is established as a 3-port coupler.

In an embodiment, the measurement system may comprise at least one further directional coupler, wherein the at least one further directional coupler is configured to forward the phase reference signal the analysis circuit. The at least one further directional coupler may further be configured to forward the phase reference signal to a measurement port, to another electronic component, or to another signal path.

In some embodiments, the at least one further directional coupler is established as a 3-port coupler.

In an embodiment, the measurement system may comprise at least one further DDS circuit, wherein the measurement system comprises a common clock source for the at least one DDS circuit and for the at least one further DDS circuit. However, it is also conceivable that different clock sources are provided for the at least one DDS circuit and for the at least one further DDS circuit.

Embodiments of the present disclosure further provide a method of operating a direct digital synthesizer (DDS) circuit, wherein the DDS circuit is established according to any one of the embodiments described above. In an embodiment, the method comprises the steps of: generating, by the DDS circuit, an analog output signal; receiving, by an analysis circuit, the analog output signal and a phase reference signal; determining, by the analysis circuit, a PSW based on the analog output signal and based on the phase reference signal; and adapting, by the phase correction sub-circuit of the DDS circuit, the phase signal output by the phase accumulator circuit based on the PSW.

Regarding the further advantages and properties of the method, reference is made to the explanations given above with respect to the DDS circuit and the measurement system, which also hold for the method and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
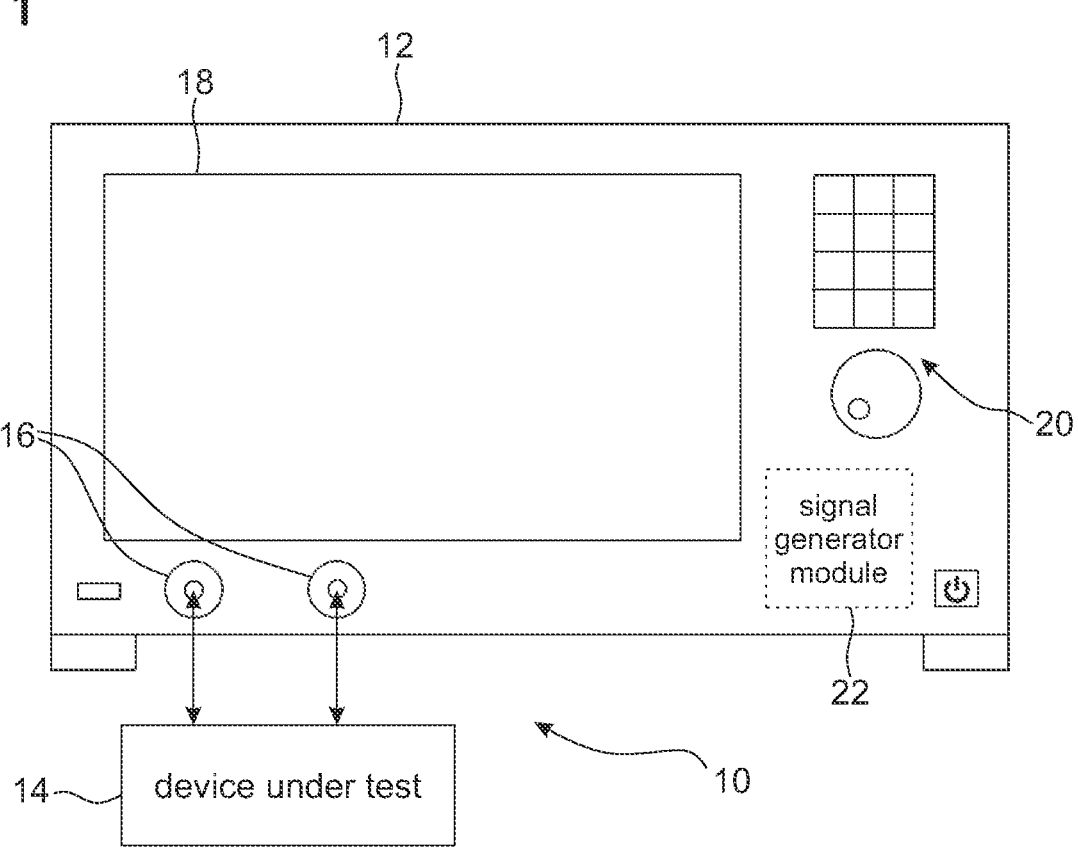
FIG. 1 schematically shows a measurement system according to an embodiment of the present disclosure.

FIG. 1 schematically shows an example of a measurement system 10 comprising a measurement instrument 12 and a device under test 14. In general, the measurement instrument 12 may be established as any type of measurement instrument suitable to perform measurements on the electronic device under test 14. For example, the measurement instrument 12 may be established as an oscilloscope, for example as a digital oscilloscope, as a vector network analyzer, as a spectrum analyzer, as a signal generator, etc.

In the embodiment shown, the measurement instrument 12 comprises two measurement ports 16, wherein measurements can be conducted on the device under test 14 via the measurement ports 16. In general, signals can be received from the device under test 14 and/or forwarded to the device under test 14 via the measurement ports 16 in order to perform the measurements on the device under test 14. It is to be understood that the measurement instrument 12 may comprise an arbitrary number of measurement ports 16 other than two.

The measurement instrument 12 may further comprise a display 18 and/or control interface 20, wherein settings of the measurement instrument 12 may be adaptable by a user via the control interface 20. In an embodiment, the control interface may include a touchscreen, one or more switches, a keypad, etc.

Figure 2:
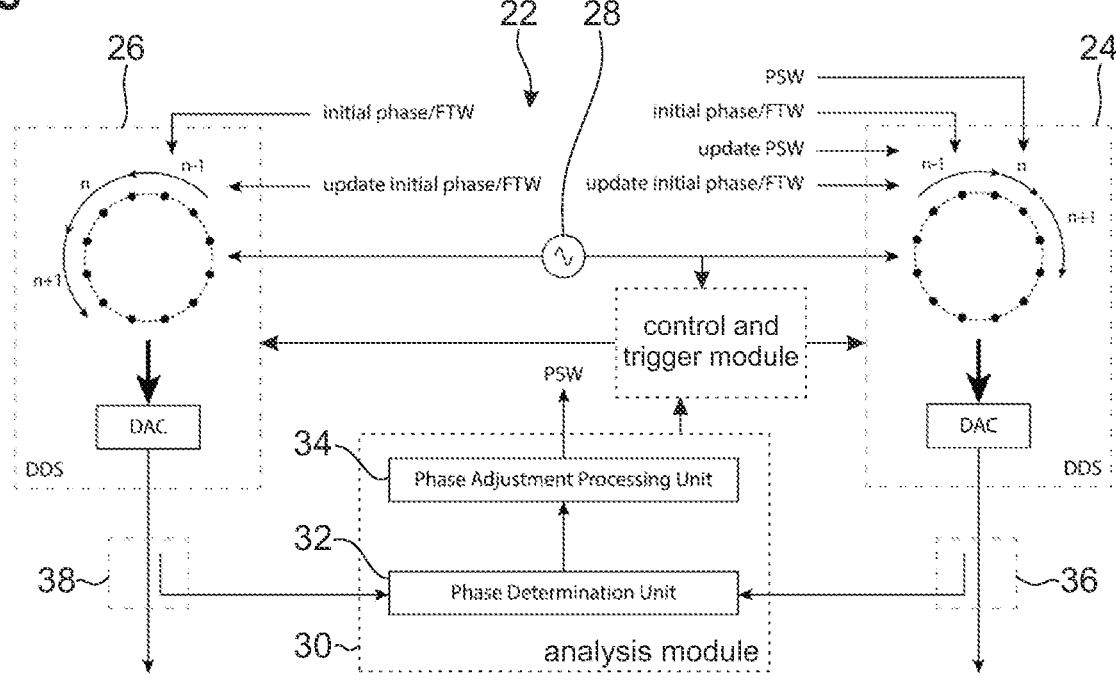
FIG. 2 schematically shows an example of a signal generator circuit of the measurement system of FIG. 1 in more detail.

The measurement instrument 12 further comprises a signal generator circuit 22, an example of which is shown in more detail in FIG. 2. In the example embodiment shown in FIG. 2, the signal generator circuit 22 comprises a first direct digital synthesizer (DDS) circuit 24 and a second DDS circuit 26. The first DDS circuit 24 and the second DDS circuit 26 are configured to generate an analog output signal, respectively. Accordingly, the signal generator circuit 22 is configured to generate two analog outputs signals that may be employed in order to conduct measurements on the device under test 14.

However, it is to be understood that the measurement system 10, for example the signal generator circuit 22, may comprise an arbitrary number of DDS circuits.

The analog output signals may be used as reference signals for conducting the measurements. As another example, the analog output signals may be forwarded to different ports of the device under test 14, for example wherein the analog output signals may correspond to a differential signal. The analog output signals may be processed by the device under test 14 and/or partially reflected at input ports of the device under test 14, and the corresponding processed and/or reflected signals may be measured by the measurement instrument 12.

In the example embodiment shown in FIG. 2, the signal generator circuit 22 further comprises a clock source 28 that is configured to provide a clock signal to the first DDS circuit 24 and to the second DDS circuit 26. However, in another embodiment, the signal generator circuit 22 comprises a dedicated clock source for each DDS circuit 24, 26.

In an embodiment, the signal generator circuit 22 further comprises an analysis circuit 30 that comprises a phase determination unit 32 and a phase adjustment processing circuit 34, the functionality of which will be described in more detail below.

Still referencing the embodiment of FIG. 2, the signal generator circuit 22 further comprises a first directional coupler 36 that is configured to forward the analog output signal of the first DDS circuit 24 to the analysis circuit 30. The first directional coupler 36 is further configured to forward the analog output signal of the first DDS circuit 24 to one of the measurement ports 16 or to another electronic component of the measurement instrument 12. In some embodiments, the first directional coupler 36 is established as a 3-port coupler.

In an embodiment, the signal generator circuit 22 further comprises a second directional coupler 38 that is configured to forward the analog output signal of the second DDS circuit 26 to the analysis circuit 30. The second directional coupler 38 is further configured to forward the analog output signal of the second DDS circuit 26 to one of the measurement ports 16 or to another electronic component of the measurement instrument 12. The second directional coupler 38 may also be established as a 3-port coupler.

In an embodiment, the signal generator circuit 22 further comprises a control and trigger circuit 39, the functionality of which will be described in more detail below.

Figure 3:
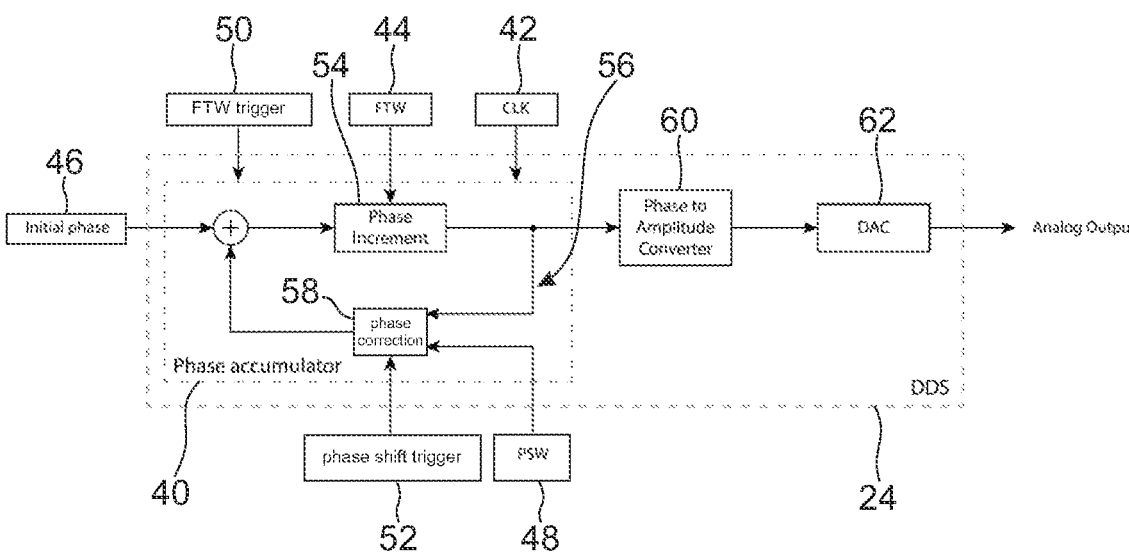
FIG. 3 schematically shows a DDS circuit according to an embodiment of the present disclosure.

FIG. 3 schematically shows a first embodiment of the first DDS circuit 24. The first DDS circuit 24 may be integrated on a dedicated DDS chip. Alternatively, the first DDS circuit 24 may be integrated on a chip together with other electronic components of the measurement instrument 12.

As shown in FIG. 3, the DDS circuit 24 comprises a phase accumulator circuit 40. The phase accumulator circuit 40 comprises a clock input 42 that is configured to receive a clock signal having a predefined frequency, for example the clock signal generated by the clock source 28.

In the embodiment of FIG. 3, the phase accumulator circuit 40 further comprises a frequency tuning register 44 that is configured to receive and save a frequency tuning word (FTW), for example from the control and trigger circuit 39. In general, the FTW determines a frequency of an output signal of the DDS circuit 24 in relation to the frequency of the clock signal, as is well-known in the state of the art related to direct digital synthesizers.

The phase accumulator circuit 40 further comprises, for example, an initial phase register 46 being configured to receive and save an initial phase for the phase accumulator circuit 40. In some embodiments, the frequency tuning register 44 and the initial phase register 46 may also be integrated into a single register.

In the embodiment of FIG. 3, the phase accumulator circuit 40 further comprises a phase shift register 48 being configured to receive and save a phase shift word (PSW), for example from the control and trigger circuit 39 and/or from the analysis circuit 30. Moreover, the phase accumulator circuit 40 comprises an FTW trigger input 50 and a phase shift trigger input 52. The FTW trigger input 50 is configured to receive an FTW trigger signal, for example from the control- and trigger circuit 39. The phase shift trigger input 52 is configured to receive a phase shift trigger signal, for example from the control- and trigger circuit 39.

The phase accumulator circuit 40 further comprises, for example, a phase increment sub-circuit 54 and a feedback path 56. The phase increment sub-circuit 54 is configured to increment a phase signal output by the phase accumulator circuit 40 by a predetermined phase increment based on the clock signal and/or based on the FTW. The feedback path 56 is configured to feed back the phase signal to the phase increment sub-circuit 54.

The phase accumulator circuit 40 further comprises, for example, a phase correction sub-circuit 58. In general, the phase correction sub-circuit 58 is configured to adapt the phase signal fed back to the phase increment sub-circuit 54 based on the PSW, as will be described in more detail below.

In the embodiment shown in FIG. 3, the first DDS circuit 24 further comprises a converter circuit 60 and a digital-to-analog converter (DAC) 62. The converter circuit 60 is provided downstream of the phase accumulator circuit 40, and is configured to convert the phase signal output by the phase accumulator circuit 40 into an amplitude signal.

In general, the converter circuit 60 is configured to map the phase of the phase signal to a corresponding amplitude of the amplitude signal, such that signals having arbitrary shape can be generated, e.g. sine-shaped amplitude signals, sawtooth-shaped amplitude signals, etc.

The DAC 62 is provided downstream of the converter circuit 60. The DAC 62 is configured to convert a digital output signal of the first DDS circuit 24, namely the amplitude signal output by the converter circuit 60, into an analog output signal of the first DDS circuit 24.

The second DDS circuit 26 may be established identically to the first DDS circuit 24 described above and hereinafter. However, in principle the second DDS circuit 26 may be established without the phase shift register 48, the phase shift trigger input 52, and the phase correction sub-circuit 58.

Figure 4:
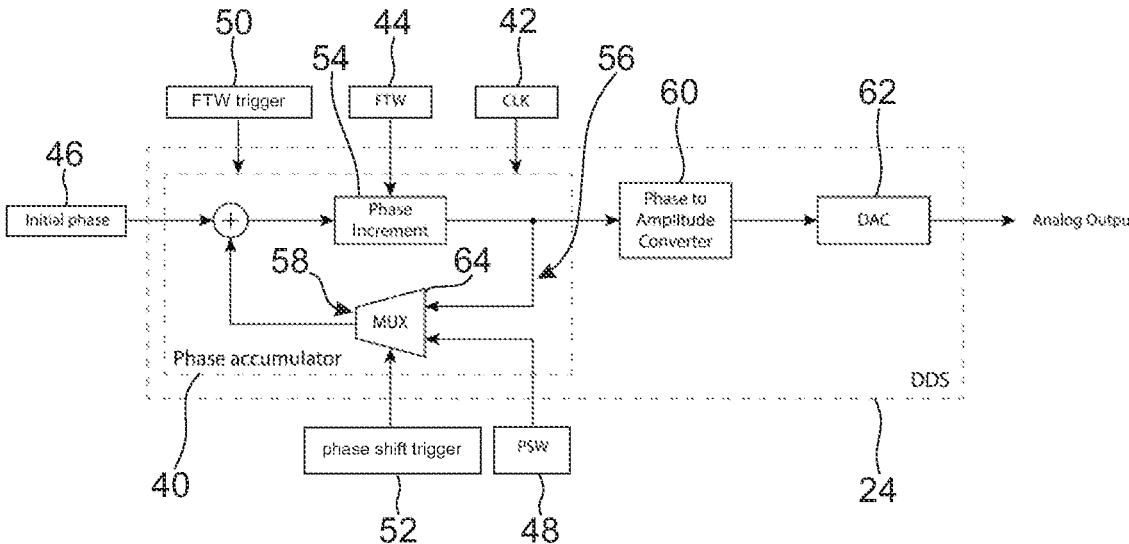
FIG. 4 schematically shows a first embodiment of the DDS circuit of FIG. 3

FIG. 4 shows another embodiment of the first DDS circuit 24 described above or of the phase correction sub-circuit 58 of the first DDS circuit 24 described above. The phase correction sub-circuit 58 comprises a multiplexer sub-circuit 64 that is connected with the phase increment sub-circuit 54 via the feedback path 56. Moreover, the multiplexer sub-circuit 64 is connected with the phase shift register 48 and with the phase shift trigger input 52.

In the embodiment shown, the multiplexer sub-circuit 64 is configured to selectively forward the phase signal output by the phase increment sub-circuit 54 or a corrected phase signal to the phase increment sub-circuit 54. Thus, in this case, the PSW saved in the phase shift register 48 corresponds to the corrected phase signal, i.e. a desired phase signal that should be output by the phase accumulator circuit 40 in the current clock cycle.

During normal operation, the multiplexer sub-circuit 64 is controlled by the control and trigger circuit 39 to feed back the phase signal output by the phase increment sub-circuit 54 to the phase increment sub-circuit 54. In order to adapt the phase of the (analog) output signal of the first DDS circuit 24, the multiplexer sub-circuit 64 is controlled by the control and trigger circuit 39 to forward the corrected phase signal saved in the phase shift register 48 to the phase increment sub-circuit 54 for exactly one clock cycle of the clock signal. In other words, the phase signal output by the phase increment sub-circuit 54 is replaced by the corrected phase signal for one clock cycle.

In some embodiments, the control and trigger circuit 39 generates a phase shift trigger signal that is forwarded to the multiplexer sub-circuit 64 via the phase shift trigger input 52. Upon receiving the phase shift trigger signal, the multiplexer sub-circuit 64 forwards the corrected phase signal saved in the phase shift register 48 to the phase increment sub-circuit 54 for exactly one clock cycle.

Figure 5:
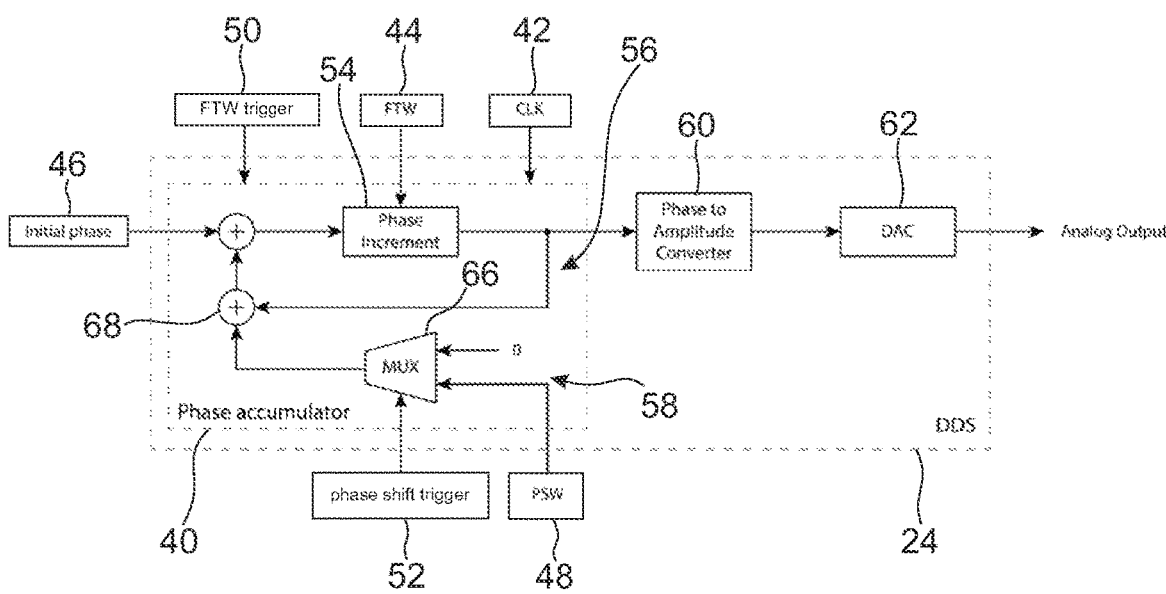
FIG. 5 schematically shows a second embodiment of the DDS circuit of FIG. 3.

FIG. 5 shows yet another embodiment of the first DDS circuit 24 described above or another embodiment of the phase correction sub-circuit 58 of the first DDS circuit 24 described above.

As shown in FIG. 5, the phase correction sub-circuit 58 comprises a multiplexer sub-circuit 66 that is connected with the phase shift register 48 and with the phase shift trigger input 52. The phase correction sub-circuit 58 further comprises an adder sub-circuit 68 that is provided downstream of the multiplexer sub-circuit 66.

The multiplexer sub-circuit 58 is configured to selectively forward a phase correction signal stored in the phase shift register 48 or a zero-signal to the adder sub-circuit 66, wherein the zero-signal does not alter the phase signal when added to the phase signal. Thus, in this case, the PSW saved in the phase shift register 48 corresponds to the phase correction signal, i.e. a difference between the desired phase signal and the actual phase signal output by the phase accumulator circuit 40 in the current clock cycle.

During normal operation, the multiplexer sub-circuit 66 is controlled by the control and trigger circuit 39 to forward the zero-signal to the adder sub-circuit 68 or to forward no signal at all. In order to adapt the phase of the (analog) output signal of the first DDS circuit 24, the multiplexer sub-circuit 66 is controlled to forward the phase correction signal to the adder sub-circuit 68 for exactly one clock cycle. The phase correction signal is added to the phase signal fed back to the phase increment sub-circuit 54 by the adder sub-circuit 68, such that the phase signal fed back to the phase increment sub-circuit 54 is adapted for one clock cycle.

Therein, it is to be understood that the phase correction signal may have positive or negative sign, i.e. the adder sub-circuit 68 may in fact add or subtract a certain phase value to or from the phase signal fed back to the phase increment sub-circuit 54.

Figure 6:
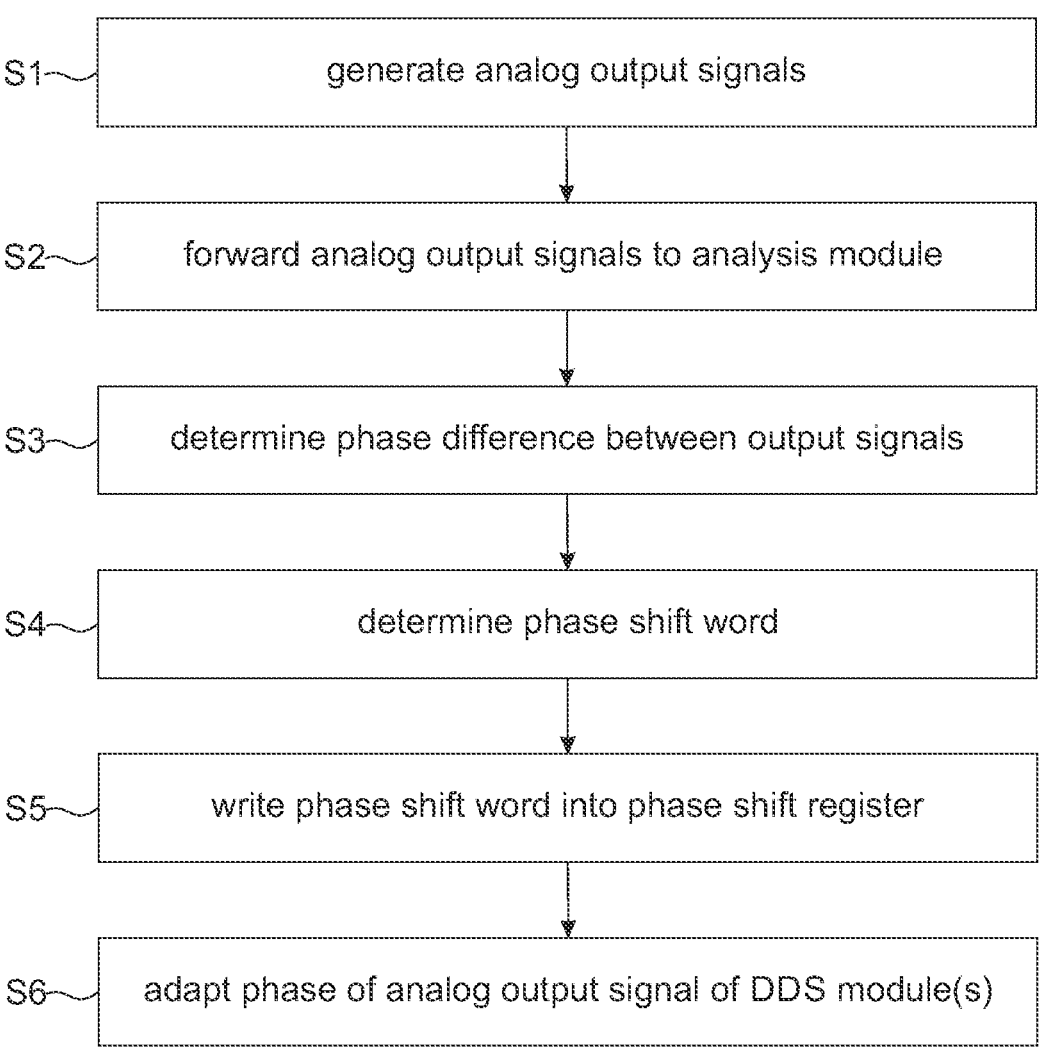
FIG. 6 shows an example flow chart of a method of operating a DDS circuit according to an embodiment of the present disclosure.

The measurement system 10 described above is configured to perform a method of operating the first DDS circuit 24. An example of the method is described in the following with reference to FIG. 6.

An analog output signal is generated by the first DDS circuit 24 and by the second DDS circuit 26, respectively (step S1).

The control and trigger circuit 39 may initialize the DDS circuits 24, 26 by providing initial phase values to the initial phase registers 46 of the DDS circuits 24, 26, and by providing FTWs to the frequency tuning registers 44 of the DDS circuits 24, 26. The initial phase values are written into the initial phase registers 46, and the FTWs are written into the frequency tuning registers 44 of the DDS circuits 24, 26.

The control and trigger circuit 39 may then control the DDS circuits 24, 26 to start generating the analog outputs signals by generating an FTW trigger signal and by providing the FTW trigger signal to the FTW trigger inputs 50 of the DDS circuits 24, 26. Upon receiving the FTW trigger signal, the DDS circuits 24, 26 start generating the analog output signals.

The analog output signals are forwarded to the analysis circuit 30 by the first directional coupler 36 and by the second directional coupler 38 (step S2).

A phase difference between the output signals of the DDS circuits 24, 26 is determined by the phase determination unit 32 (step S3).

Therein, the phase determination unit 32 may determine the phase difference between the output signals with respect to certain measurement planes of the measurement system 10 based on calibration data, wherein the calibration data takes phase differences between the phase determination unit 32 and the measurement planes into account.

Accordingly, the determined phase difference may correspond to the phase difference between the output signal of the first DDS circuit 24 at a first measurement plane and the output signal of the second DDS circuit at a second measurement plane. For example, the measurement planes may be adaptable by a user, e.g. via the control interface 20 of the measurement instrument 12.

The determined phase difference is forwarded to the phase adjustment processing unit 34. A PSW is determined for the first DDS circuit 24 by the phase adjustment processing unit 34 based on the determined phase difference (step S4).

Alternatively or additionally to steps S3 and S4 described above, the control- and trigger circuit 39 may comprise a memory with a data set, wherein the data set comprises FTWs being compatible with the first DDS circuit 24 and corresponding PSWs.

Accordingly, the PSW may be determined based on the data set, namely based on the FTW of the first DDS circuit 24, for example based on the FTW provided to the frequency tuning registers 44 of the first DDS circuit 24 by the control and trigger circuit 39.

The PSW is forwarded to the phase shift register 48 of the first DDS circuit 24, and the PSW is written into the phase shift register 48 (step S5).

The PSW may be forwarded to the phase shift register 48 of the first DDS circuit 24 directly or via the control- and trigger circuit 39.

The phase of the output signal of the first DDS circuit 24 (at the respective measurement plane) is adapted by the phase correction sub-circuit 58 of the first DDS circuit 24 (step S6).

Accordingly, a desired phase relation between the output signals of the DDS circuits 24, 26 is obtained by adapting the phase of the output signal of the first DDS circuit 24.

For example, as described above, the control and trigger circuit 39 generates a phase shift trigger signal that causes the phase correction sub-circuit 58 to adapt the phase of the phase signal fed back to the phase-increment sub-circuit 54 during a single clock cycle. Thereby, the phase of the output signal of the first DDS circuit 24 is adapted, for example in the next clock cycle.

Steps S3 to S6 may be repeated in predefined time intervals. Thus, the phase relation between the analog output signals of the DDS circuits 24, 26 may be monitored continuously, and the phase of the analog output signal of the first DDS circuit 24 may be corrected by providing an appropriate PSW to the first DDS circuit 24 if necessary.

Alternatively or additionally, steps S1 to S6 described above may be performed after the FTW of at least one of the DDS circuits 24, 26 has been updated. Thus, it is ensured that a desired phase relation between the analog output signals of the DDS circuits 24, 26 is obtained after the FTW has been updated.

Certain embodiments disclosed herein include systems, apparatus, modules, units, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In some embodiments, one or more of the components referenced above include circuitry programmed to carry out one or more steps of any of the methods disclosed herein. In some embodiments, one or more computer-readable media associated with or accessible by such circuitry contains computer readable instructions embodied thereon that, when executed by such circuitry, cause the component or circuity to perform one or more steps of any of the methods disclosed herein.

In some embodiments, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In some embodiments, computer-readable media is any medium that stores computer readable instructions, or other information non-transitorily and is directly or indirectly accessible to a computing device, such as processor circuitry, etc., or other circuity disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In some embodiments, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein. All such combinations or sub-combinations of features are within the scope of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

The present application may reference quantities and numbers. Unless specifically stated, such quantities and numbers are not to be considered restrictive, but exemplary of the possible quantities or numbers associated with the present application. Also, in this regard, the present application may use the term "plurality" to reference a quantity or number. In this regard, the term "plurality" is meant to be any number that is more than one, for example, two, three, four, five, etc. The term "about," "approximately," etc., means plus or minus 5% of the stated value.

For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

In the detailed description herein, references to "one embodiment", "an embodiment", "an example embodiment", "some embodiments", etc., indicate that the embodiment(s) described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or subcombinations of features are within the scope of the present disclosure.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A measurement system, comprising:
a direct digital synthesizer (DDS) circuit;
at least one further direct digital synthesizer (DDS) circuit; and
an analysis circuit,
wherein the direct digital synthesizer (DDS) circuit comprises a phase accumulator circuit, the phase accumulator circuit comprising:
a clock input being configured to receive a clock signal;
a frequency tuning register being configured to receive a frequency tuning word (FTW);
a phase shift register being configured to receive a phase shift word (PSW);

a phase increment sub-circuit being configured to increment a phase signal output by the phase accumulator circuit by a predetermined phase increment based on the clock signal and/or based on the FTW;
a feedback path being configured to feed back the phase signal to the phase increment sub-circuit; and
a phase correction sub-circuit, wherein the phase correction sub-circuit is configured to adapt the phase signal fed back to the phase increment sub-circuit based on the phase shift word,
wherein the at least one further direct digital synthesizer (DDS) circuit is configured to generate a further analog output signal,
wherein the analysis circuit is configured to:
receive an analog output signal of the direct digital synthesizer (DDS) circuit;
receive the further analog output signal of the at least one further DDS circuit as a phase reference signal; and
determine the phase shift word (PSW) based on the analog output signal of direct digital synthesizer (DDS) circuit and based on the further analog output signal of the at least one further direct digital synthesizer (DDS) circuit.

2. The measurement system of claim 1, wherein the phase correction sub-circuit is configured to receive a phase shift trigger signal, and wherein the phase correction sub-circuit is configured to adapt the phase signal fed back to the phase increment sub-circuit upon receiving the phase shift trigger signal.

3. The measurement system according to claim 1, wherein the phase correction sub-circuit is configured to replace the phase signal fed back to the phase increment sub-circuit with a corrected phase signal.

4. The measurement system according to claim 3, wherein the phase correction sub-circuit comprises a multiplexer sub-circuit, wherein the multiplexer sub-circuit is configured to selectively forward the phase signal or the corrected phase signal to the phase increment sub-circuit.

5. The measurement system of claim 3, wherein the phase correction sub-circuit is configured to replace the phase signal fed back to the phase increment sub-circuit with a corrected phase signal during a single clock cycle of the clock signal.

6. The measurement system according to claim 1, wherein the phase correction sub-circuit is configured to add a phase correction signal to the phase signal fed back to the phase increment sub-circuit.

7. The measurement system of claim 6, wherein the phase correction sub-circuit comprises an adder sub-circuit, wherein the adder sub-circuit is configured to add the phase correction signal to the phase signal fed back to the phase increment sub-circuit.

8. The measurement system of claim 7, wherein the phase correction sub-circuit comprises a multiplexer sub-circuit, wherein the multiplexer sub-circuit is configured to selectively forward the phase correction signal to the adder sub-circuit.

9. The measurement system of claim 6, wherein the phase correction sub-circuit is configured to add the phase correction signal to the phase signal fed back to the phase increment sub-circuit during a single clock cycle of the clock signal.

10. The measurement system of claim 1, further comprising a measurement instrument, wherein the direct digital synthesizer (DDS) circuit and/or the at least one further direct digital synthesizer (DDS) circuit is integrated into the measurement instrument.

11. The measurement system according to claim 1, wherein the analysis circuit is configured to repeatedly determine the phase shift word (PSW) in predefined time intervals.

12. The measurement system according to claim 1, further comprising a directional coupler, wherein the directional coupler is configured to forward the analog output signal of the direct digital synthesizer (DDS) circuit to the analysis circuit.

13. The measurement system according to claim 1, further comprising a common clock source for the direct digital synthesizer (DDS) circuit and for the at least one further direct digital synthesizer (DDS) circuit.

14. A method of operating a direct digital synthesizer (DDS) circuit by a measurement system, the measurement system comprising the direct digital synthesizer (DDS) circuit, at least one additional direct digital synthesizer (DDS) circuit, and an analysis circuit, wherein the direct digital synthesizer (DDS) circuit comprises a phase accumulator circuit having a clock input configured to receive a clock signal, a frequency tuning register configured to receive a frequency tuning word, a phase shift register configured to receive a phase shift word, a phase increment sub-circuit configured to increment a phase signal output by the phase accumulator circuit by a predetermined phase increment based on the clock signal or based on the frequency tuning word, a feedback path configured to feed back the phase signal to the phase increment sub-circuit, and a phase correction sub-circuit configured to adapt the phase signal fed back to the phase increment sub-circuit based on the phase shift word, the method comprising:

generating, by the direct digital synthesizer (DDS) circuit, an analog output signal;

generating, by the at least one additional direct digital synthesizer (DDS) circuit, an additional analog output signal;

receiving, by the analysis circuit, the analog output signal of the direct digital synthesizer (DDS);

receiving, by the analysis circuit, the additional analog output signal of the additional direct digital synthesizer (DDS) as a phase reference signal;

determining, by the analysis circuit, a phase shift word based on the analog output signal and based on the phase reference signal; and adapting, by the phase correction sub-circuit of the direct digital synthesizer (DDS) circuit, the phase signal output by the phase accumulator circuit based on the phase shift word.

15. A measurement system, comprising:

a first direct digital synthesizer circuit configured to generate a first analog output signal, the first direct digital synthesizer circuit comprising a phase accumulator circuit, the phase accumulator circuit comprising:

a clock input configured to receive a clock signal;

a frequency tuning register configured to receive a frequency tuning word;

a phase shift register configured to receive a phase shift word;

a phase increment sub-circuit configured to increment a phase signal output by the phase accumulator circuit by a predetermined phase increment based on the clock signal or on the frequency tuning word;

a feedback path being configured to feed back the phase signal to the phase increment sub-circuit; and a phase correction sub-circuit configured to adapt the phase signal fed back to the phase increment sub-circuit based on the phase shift word;

a second direct digital synthesizer circuit configured to generate a second analog output signal; and an analysis circuit configured to:

receive the first analog output signal of the first direct digital synthesizer circuit;

receive the second analog output signal of the second direct digital synthesizer circuit, the second analog output signal being a phase reference signal, and determine the phase shift word based on the first analog output signal of the first direct digital synthesizer circuit and based on the second analog output signal of the second direct digital synthesizer circuit.

\* \* \* \* \*